(12) United States Patent
Gross

(10) Patent No.: US 11,152,590 B2
(45) Date of Patent: Oct. 19, 2021

(54) METHOD AND DEVICE FOR ENCAPSULATING COMPONENTS

(71) Applicants: Leander Kilian Gross, Langebrück (DE); Mascha Elly Gross, Langebrück (DE)

(72) Inventor: Harald Gross, Langebrück (DE)

(73) Assignees: Leander Gross, Langebrück (DE); Mascha Gross, Langebrück (DE)

( * ) Notice: Subject to any disclaimer, the term of this patent is extended or adjusted under 35 U.S.C. 154(b) by 0 days.

(21) Appl. No.: 16/309,761

(22) PCT Filed: Jun. 14, 2017

(86) PCT No.: PCT/EP2017/064615
§ 371 (c)(1),
(2) Date: Dec. 13, 2018

(87) PCT Pub. No.: WO2017/216261
PCT Pub. Date: Dec. 21, 2017

(65) Prior Publication Data
US 2019/0157611 A1    May 23, 2019

(30) Foreign Application Priority Data
Jun. 14, 2016   (DE) .......................... 102016110868.5

(51) Int. Cl.
*C03C 27/06* (2006.01)
*H01L 51/52* (2006.01)
(Continued)

(52) U.S. Cl.
CPC .......... *H01L 51/5246* (2013.01); *C03C 27/00* (2013.01); *H01L 21/50* (2013.01);
(Continued)

(58) Field of Classification Search
CPC .......................... H01L 51/5246; C03C 27/042
(Continued)

(56) References Cited

U.S. PATENT DOCUMENTS 4,313,092 A * 1/1982 Kaule .................... H01S 3/025
372/70
8,202,407 B1   6/2012 Harmala
(Continued)

FOREIGN PATENT DOCUMENTS

DE    102005044523 A1   3/2007
DE    102012107468 A1   3/2014

OTHER PUBLICATIONS

International Preliminary Report on Patentability (and English translation) for International Application No. PCT/EP2017/064615 dated Dec. 18, 2018.
(Continued)

*Primary Examiner* — Christopher M Raabe
(74) *Attorney, Agent, or Firm* — Heslin Rothenberg Farley & Mesiti P.C.; Jacquelyn A. Graff, Esq.

(57) ABSTRACT

A method and a device for hermetically encapsulating components using at least one gas discharge lamp, an inorganic material that is transparent for light and a light-absorbing inorganic medium, are provided. With a suitable selection, inorganic materials or inorganic media guarantee a very low level of permeability for oxygen, water vapor and reactive gases in contrast to organic materials or organic media. The encapsulation occurs in a time period of less than one second. In addition, the average temperature of the component only increases slightly, such that even components with temperature-sensitive regions can be encapsulated.

12 Claims, 1 Drawing Sheet

(51) Int. Cl.
  *H01L 21/50* (2006.01)
  *C03C 27/00* (2006.01)
  *C03C 3/072* (2006.01)
  *C03C 8/24* (2006.01)

(52) U.S. Cl.
  CPC .......... *H01L 51/5237* (2013.01); *C03C 3/072* (2013.01); *C03C 8/245* (2013.01); *C03C 27/005* (2013.01); *C03C 27/06* (2013.01)

(58) Field of Classification Search
  USPC ....................................................... 445/25
  See application file for complete search history.

(56) References Cited

U.S. PATENT DOCUMENTS

| | | |
|---|---|---|
| 2003/0066311 A1 | 4/2003 | Li et al. |
| 2004/0207314 A1 | 10/2004 | Aitken et al. |
| 2007/0128966 A1* | 6/2007 | Becken ................... C03C 27/06 445/25 |
| 2007/0128967 A1* | 6/2007 | Becken ............... H01L 51/5246 445/25 |
| 2008/0106194 A1* | 5/2008 | Logunov ................ B32B 17/06 313/512 |
| 2010/0304513 A1* | 12/2010 | Nguyen ................ H01L 51/448 438/27 |
| 2012/0287026 A1* | 11/2012 | Masuda .............. H01L 51/5246 345/76 |
| 2017/0098797 A1* | 4/2017 | Eom ................... H01L 27/3276 |

OTHER PUBLICATIONS

International Search Report issued in PCT/EP2017/064615 dated Sep. 19, 2017.

* cited by examiner

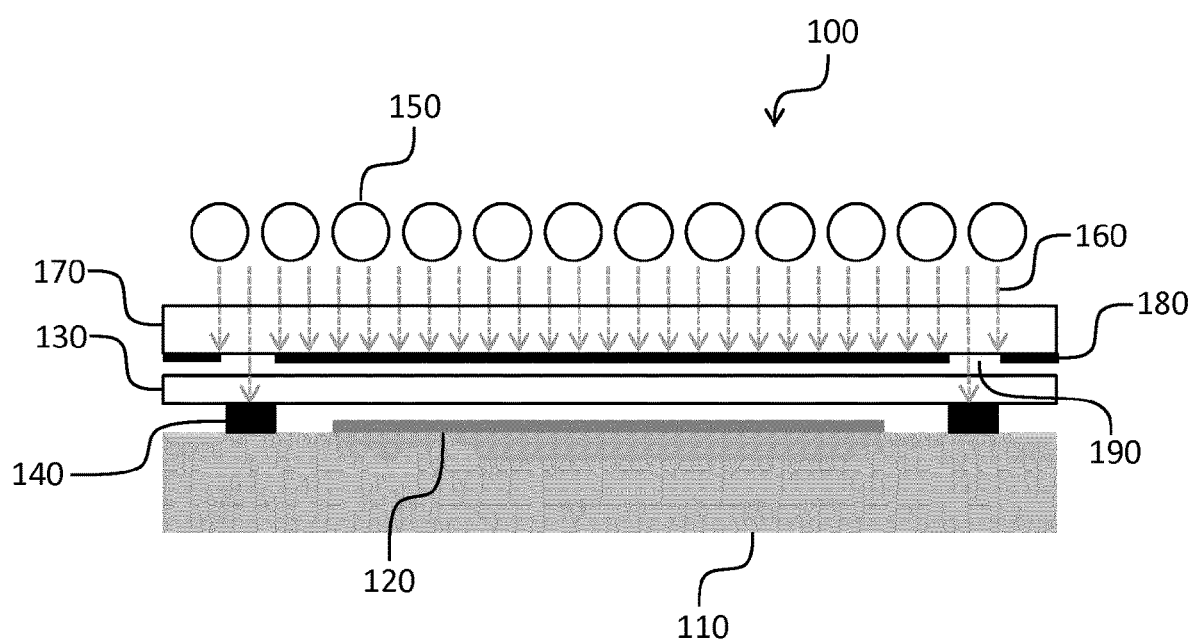

METHOD AND DEVICE FOR ENCAPSULATING COMPONENTS

CROSS REFERENCE TO RELATED APPLICATIONS

This application is the National Phase filing under 35 U.S.C. § 371 of International Application No.: PCT/EP2017/064615, filed on Jun. 14, 2017, and published on Dec. 21, 2017 as WO 2017/216261 A1, and claims priority to German Application No.: 10 2016 110 868.5, filed on Jun. 14, 2016. The contents of each of the prior applications are hereby incorporated by reference herein in their entirety.

BACKGROUND ART

The invention relates to a method and a device for hermetically encapsulating components. Components means, for example, sensors, display screens, photovoltaic modules, or microelectronics, which have to be protected from environmental influences such as water vapor, oxygen, or also reactive gases.

In many cases, for example in OLED display screens, the component is covered by a glass pane of equal area and adhesively bonded to the component at the edge of the area. The adhesive used in this case can be an epoxy resin, which is activated by means of UV light for polymerization. The epoxy resin has a low, but non-negligible permeability to water vapor or oxygen, in contrast to a glass pane, so that in the case of OLED display screens, a getter additionally has to be introduced into the encapsulation to also protect the component for multiple years from oxygen or ambient humidity.

In rotation rate sensors made of silicon for automobiles or aircraft, inter alia, a good vacuum is a condition for a high quality of a vibration of small masses on the surface of the component and the measuring accuracy thus achievable of position changes. For this purpose, epoxy resins using getter are not sufficient, so that, for example, the organic adhesive is replaced by a glass solder. Glass solder is a glass having particularly low softening temperature of, for example, 400° C. because of the addition of boron, lead oxide, and also other materials. For the encapsulation, firstly a paste having glass solder is applied to the edge of a glass pane via screen printing and subsequently the organic binders and solvents of the paste are removed by drying at temperatures of, for example, 300° C. The glass pane is thereafter pressed in a vacuum chamber onto the surface having the vibrating mass of the component and the glass solder located therebetween is caused to melt by means of infrared radiators. After cooling in vacuum, the space between component and glass pane and therefore also the immediate surroundings of the vibrating mass remain evacuated, even after aerating of the vacuum furnace. The disadvantage of this method is that both the component and the glass pane reach the same temperatures as the glass solder. In addition, the heating and cooling time typically lasts multiple minutes and is thus obstructive for a production having high throughput.

Because of the high melting temperatures, glass solder is not suitable for encapsulation of OLED display screens in conventional furnaces, since the organic material does not tolerate temperatures above approximately 100° C. For many types of components, there is a temperature restriction significantly below the melting temperature of glass solders, in particular if they contain organic materials.

In the patent application US 2004/207314 A1 "Glass Package that is Hermetically Sealed with a Frit and Method of Fabrication", a method is described which briefly heats the glass solder up to the melting point by pulsed laser light. In this case, the heating and the cooling of the substrate take place so rapidly that neither the component nor the glass pane for the encapsulation heat up significantly. The disadvantage of this method is the sequential heating of the glass solder, i.e. the generally punctiform laser beam results in punctiform heating of the glass solder. For complete encapsulation, the laser beam has to be scanned over the entire surface of the glass solder. It has been proven in this case that a certain scanning speed has to be maintained with corresponding laser power to keep thermomechanical tensions below the fracture limit of the materials and components used. This substantially restricts the throughput in production, in particular if it involves large components such as photovoltaic modules or high piece counts as with rotation rate sensors.

Infrared lamps are mentioned as an alternative to lasers in the patent application. Only light powers per unit of area which are multiple orders of magnitude below lasers at, for example, equal wavelength can be achieved using these lamps. Therefore, the exposure time required for melting the glass solder rises accordingly to at least one to several seconds. As a consequence, because of the heat conduction, a distance of multiple millimeters to centimeters has to be maintained between glass solder and the temperature-sensitive region of the component, so as not to exceed an application-specific maximum temperature in the latter. Therefore, infrared lamps are excluded from applications in which a combination of great temperature sensitivity, as with OLEDs, and good area utilization and/or high production yield is specified.

The goal of the invention is a method for heating a glass solder or also other light-absorbing inorganic means for the hermetic encapsulation of a component with the aid of a glass plate or also other light-transparent inorganic materials. In this case, temperature-sensitive regions of the component are not to be heated substantially above room temperature as per the encapsulation using a laser in the above-mentioned patent application US 2004/207314 A1. The throughput in production is to be multiple times greater than the encapsulation using a laser.

Light in general means electromagnetic waves in a spectral range which can be registered by the human eye, i.e. a wavelength range from approximately 380 nm to 780 nm. This spectral range is also meant for light-absorbing, light-reflective, and transparent materials. In some cases, the expansion of this spectral range to electromagnetic wavelength ranges directly adjoining thereon can be reasonable. For example, the emission maximum of halogen lamps is at approximately 920 nm, wherein small UV components are also included in the emission spectrum, i.e. wavelengths below 380 nm. Silicate glasses are generally transparent beyond the range visible to the human eye.

Light-transparent inorganic materials also include sapphire, i.e. a crystal form of aluminum oxide, and ceramics, such as aluminum nitride or aluminum oxynitride. Light-absorbing means include, in addition to an entire array of glass solders, also solders made of metal alloys or pure metal layers. For example, a thin layer of 200 nm of aluminum or gold can be applied to a glass plate, which forms a eutectic bond with a component made of silicon upon heating to 580° C. or 370° C., respectively. The specified processing temperatures are below the melting points of aluminum or gold in this case.

SUMMARY OF THE INVENTION

The current invention provides a method for encapsulating a component using an inorganic light-transparent material and using an inorganic light-absorbing means, wherein the light-absorbing means is heated for a duration of less than one second with the aid of at least one gas discharge lamp for hermetic bonding of the component to the light-transparent material.

The inorganic light-transparent material may comprise a silicate glass, and the inorganic light-absorbing means may comprise a glass solder, a solder made of a metal alloy, or metal layer.

The component may include at least one sensor, one display screen, or one semiconductor for photovoltaics or microelectronics.

A mean temperature of the component, preferably, rises by less than 80° C. due to the encapsulating method.

Advantageously, the at least one gas discharge lamp is operated as a flash lamp or using continuous power.

The present invention also provides a device for encapsulating a component according to the stated method, using an inorganic light-transparent material, and using an inorganic light-absorbing means. The device may include at least one gas discharge lamp for heating the inorganic light-absorbing means for a hermetic bond of the component to the light-transparent material, and a mask incorporated between the light-transparent material and at least the one gas discharge lamp to limit light incidence on regions of the component to be bonded with the inorganic light-absorbing means.

The at least one gas discharge lamp is configured for flash operation and/or for continuous operation.

The mask may comprise a carrier material transparent to light of the gas discharge lamp, with a light-reflecting layer having openings applied to the carrier material. The mask may be used to press the light-transparent material onto the component during the encapsulating method.

BRIEF DESCRIPTION OF THE DRAWING FIGURE

FIG. 1 shows a cross section, not to scale, of an arrangement according to the device of the present invention.

The above-described goal of the invention is achieved by the use of at least one gas discharge lamp, which enables heating times from approximately 0.1 ms (operation as a flash lamp) to approximately 1000 ms (operation using continuous power) at high light intensities. For example, multiple axial flash lamps having an electric arc length of, for example, 2 m can be arranged parallel to one another in a plane, to individually encapsulate large-area OLED televisions or photovoltaic modules. A plurality of rotation rate sensors can also be arranged in a plane which is aligned parallel to a field of flash lamps, in order to encapsulate all sensors simultaneously. A multiple of the throughput in production is thus possible in comparison to encapsulation using lasers or also in conventional furnaces.

DETAILED DESCRIPTION

FIG. 1 shows a cross section, which is not to scale, of an arrangement (100) according to the device of the invention, which prevents the exposure of the entire component (110) and/or limits the light (160) emitted by the gas discharge lamps (150) on regions having a light-absorbing absorbing inorganic means (140). The light-absorbing means (140), for example a 50-μm-thick glass solder, is applied in a prior process step (not shown) to the inorganic material (130) transparent to light, for example a glass pane for the encapsulation. The shading of the component (110) is performed by a transparent mask (170) made of a carrier material, for example quartz glass. The mask (170) is equipped with a nontransparent and light-reflective layer (180), which is only interrupted or opened at a few points (190), so that the emitted light (160) can be incident at these points on the light-absorbing means (140) for its heating. Therefore, the temperature-sensitive region (120) of the component, for example an OLED display screen, is not exposed or is heated only insignificantly. In the case of large-area components such as photovoltaic modules, gas discharge lamps (150), which are very remote from the openings (190), can be saved. Ideally, the mask (170) is used to press the material (130) onto the component (110) during the encapsulation process. In this case, the component (110) lies on an underlay (not shown). The pressing has proven to be advantageous for a hermetic encapsulation in experiments, if the pressing force induced by the weight force of the material (130) on the component (110) is not sufficient. This applies in particular in the case of small components such as sensors. Alternatively to the light-reflecting layer (180) of the mask (170), a light-absorbing layer can also be used. A light-absorbing layer can increase the light efficiency of the gas discharge lamps, however the mask (170) then has to be cooled substantially better, in particular with high throughput in the production.

LIST OF REFERENCE NUMERALS

100: device according to the invention
110: component
120: temperature-sensitive region of the component
130: inorganic light-transparent material
140: light-absorbing inorganic means
150: gas discharge lamps
160: light emitted by the gas discharge lamps
170: mask
180: light-reflecting layer on the mask
190: openings in the light-reflecting layer of the mask

The invention claimed is:

1. A method for encapsulating a component using an inorganic light-transparent material and using an inorganic light-absorbing means, comprising:
   placing a mask over the component between the light-transparent material and at least one gas discharge lamp;
   using the mask to limit light incidence to regions of the component to be bonded with the inorganic light-absorbing means;
   emitting light from the at least one gas discharge lamp over the entire mask and through openings of the mask positioned over the regions of the component; and
   heating the light-absorbing means for a duration of less than one second with the aid of the at least one gas discharge lamp for hermetic bonding of the component to the light-transparent material.

2. The method as claimed in claim 1, wherein the inorganic light-transparent material comprises a silicate glass.

3. The method as claimed in claim 1, wherein the inorganic light-absorbing means comprises a glass solder, a solder made of a metal alloy, or metal layer.

4. The method as claimed in claim 1, wherein the component includes at least one sensor, one display screen, or one semiconductor for photovoltaics or microelectronics.

5. The method as claimed in claim 1, wherein a mean temperature of the component rises by less than 80° C. due to the encapsulating method.

6. The method as claimed in claim 1, wherein the at least one gas discharge lamp is operated as a flash lamp or using continuous power.

7. A device for encapsulating a component according to the method as claimed in claim 1 using an inorganic light-transparent material, and using an inorganic light-absorbing means, the device comprising:
- at least one gas discharge lamp for heating the inorganic light-absorbing means for a hermetic bond of the component to the light-transparent material; and
- a mask incorporated between the light-transparent material and at least the one gas discharge lamp, the mask comprising a transparent carrier material and a nontransparent light-reflective layer that includes openings above the inorganic light-absorbing means, the nontransparent light-reflective layer being positioned to limit light incidence to regions of the component to be bonded with the inorganic light-absorbing means.

8. The device for encapsulating a component as claimed in claim 7, wherein the gas discharge lamp is configured for flash operation and/or for continuous operation.

9. The device as claimed in claim 7, wherein the mask is used to press the light-transparent material onto the component during the encapsulating method.

10. The device as claimed in claim 7, wherein the component includes one or more temperature-sensitive regions, and wherein the nontransparent light-reflective layer of the mask is positioned to limit light exposure to the temperature-sensitive regions.

11. The method as claimed in claim 1, further comprising:

passing the light incidence through openings in a nontransparent light-reflective layer positioned above the regions of the component for heating the regions of the component for bonding with the inorganic light-absorbing means.

12. The method as claimed in claim 1, wherein the regions of the component to be bonded with the inorganic light-absorbing means are all exposed at the same time.

\* \* \* \* \*